(12) United States Patent
Giordano

(10) Patent No.: US 7,912,881 B2
(45) Date of Patent: Mar. 22, 2011

(54) DATA COMPRESSION METHOD

(75) Inventor: Francois Giordano, Paris (FR)

(73) Assignee: Autoliv Development AB, Vargarda (SE)

( * ) Notice: Subject to any disclaimer, the term of this patent is extended or adjusted under 35 U.S.C. 154(b) by 958 days.

(21) Appl. No.: 11/721,015

(22) PCT Filed: Dec. 5, 2005

(86) PCT No.: PCT/SE2005/001834
§ 371 (c)(1),
(2), (4) Date: Jun. 6, 2007

(87) PCT Pub. No.: WO2006/062464
PCT Pub. Date: Jun. 15, 2006

(65) Prior Publication Data
US 2009/0234973 A1    Sep. 17, 2009

(30) Foreign Application Priority Data

Dec. 6, 2004    (GB) .................................. 0426709.2

(51) Int. Cl.
*G06F 7/00*    (2006.01)
*G06F 7/38*    (2006.01)
(52) U.S. Cl. .................. 708/203; 708/490; 708/495
(58) Field of Classification Search .................. 708/203, 708/490, 495
See application file for complete search history.

(56) References Cited

U.S. PATENT DOCUMENTS

| 3,424,869 | A | * | 1/1969 | Kennedy et al. ............. 704/229 |
| 5,155,772 | A | | 10/1992 | Brandman et al. |
| 6,028,893 | A | | 2/2000 | Schreib |
| 6,819,992 | B1 | | 11/2004 | Giordano |
| 2004/0146106 | A1 | * | 7/2004 | De Lameillieure ...... 375/240.12 |
| 2006/0284747 | A1 | * | 12/2006 | Moriya ........................... 341/51 |

FOREIGN PATENT DOCUMENTS

DE         3303006 A1     8/1984

* cited by examiner

*Primary Examiner* — Tan V Mai
(74) *Attorney, Agent, or Firm* — Brinks Hofer Gilson & Lione

(57) ABSTRACT

A method for transmitting the value of a parameter in a compressed form, the method comprising the steps of: accepting successive numbers representing the value of a parameter; manipulating each number, the manipulation comprising placing the number in a form comprising a mantissa and an exponent, and defining a transmission mantissa to be transmitted; transmitting to a receiver, in turn, the transmission mantissas only of the successive numbers; and receiving the transmission mantissas of the successive numbers at the receiver, characterised by the steps of maintaining a record, at the receiver, of a receiver variable, the receiver variable initially corresponding to the exponent of an initial number; formulating at the receiver, for each received transmission mantissa, a reconstructed number comprising at least the transmission mantissa and an exponent corresponding to the receiver variable; and altering the receiver variable in a first manner if the transmission mantissa of the current number fulfils a first criterion, or altering the receiver variable in a second manner if the transmission mantissa of the current number fulfils a second criterion.

21 Claims, 1 Drawing Sheet

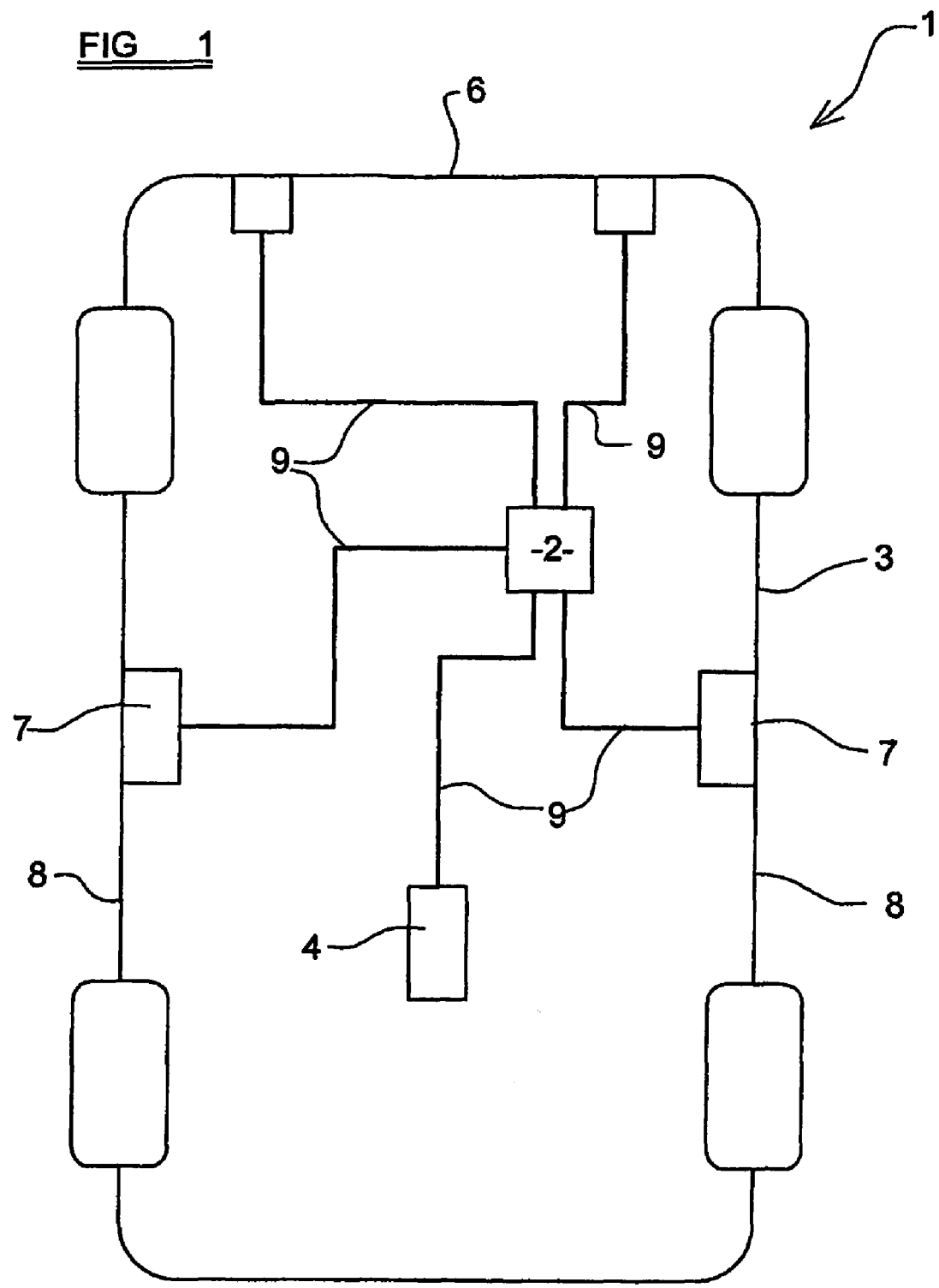

DATA COMPRESSION METHOD

This application claims priority to International Patent Application PCT/SE2005/001834, filed 5 Dec. 2005, Publication No WO 2006/062454 A1, which claimed priority to Great Britain patent application 0426709.2 filed 6 Dec. 2004.

BACKGROUND OF THE INVENTION

This invention relates to a data compression method, and in particular concerns a method for transmitting data in a compressed form in real time. The invention may be used in devices such as vehicle safety systems in which the speed of transmittal of data is important.

Both when transmitting and storing data it is often desirable to compress the data to allow quick transmission thereof, to enable use of cheaper transmission lines having lower transmission capacities, or to ensure that less memory space is required to store the data. Many types of data contain redundant information which may be discarded before transmission or storage. The amount of redundant information present in a quantity of data will depend in part upon the type of the data. By using an appropriate algorithm, it is often possible to discard some or all of the redundant information to reduce the quantity of data before transmittal or storage thereof, and to recover this information when the data is to be used again.

Compression algorithms for use with a quantity of data representing a series of consecutive values of a parameter—for example, a sound signal from a microphone or an output from a volt meter or accelerometer—may need to use values which appear before and as well as after a current value in the series of values. If this is the case, there will be a delay involved in the compression of the data, as the algorithm waits for the required subsequent value to be received. In the case of a quantity of data representing an image, the delay due to compression may be larger still, because values relating to lines adjacent a current line in the image may need to be used.

For certain applications it is, however, important that the delays involved in transmission of data are minimized. An example of such circumstances is the transmission of data from a crash sensor, for instance an accelerometer, to a control unit that controls the deployment of a safety device in a vehicle. If a crash sensor has determined that the vehicle is involved in a crash situation, any delay before, for example, an airbag is inflated should clearly be as short as possible.

It is an object of the present invention to provide a method for transmitting data in a compressed form involving minimal delays.

SUMMARY OF THE INVENTION

Accordingly, one aspect of the present invention provides a method for transmitting the value of a parameter in a compressed form, the method comprising the steps of: accepting successive numbers representing the value of a parameter; manipulating each number, the manipulation comprising placing the number in a form comprising a mantissa and an exponent, and defining a transmission mantissa to be transmitted; transmitting to a receiver, in turn, only the transmission mantissas of the successive numbers; and receiving the transmission mantissas of the successive numbers at the receiver, characterized by the steps of: maintaining a record at the receiver of a receiver variable, the receiver variable initially corresponding to the exponent of an initial number; formulating at the receiver, for each received transmission mantissa, a reconstructed number comprising at least the transmission mantissa and an exponent corresponding to the receiver variable; and altering the receiver variable in a first manner if the transmission mantissa of the current number fulfills a first criterion, or altering the receiver variable in a second manner if the transmission mantissa of the current number fulfills a second criterion.

Advantageously, the manipulation comprises the step of defining the transmission mantissa as being at least a part of the mantissa if the mantissa is below a first predetermined value, or defining the transmission mantissa as being equal to the first predetermined value if the mantissa is equal to or greater than the first predetermined value. The transmission mantissa of the current number fulfills the first criterion (referenced in the prior paragraph) when the transmission mantissa is equal to the first predetermined value. Altering the receiver variable in the first manner comprises increasing the receiver variable incrementally.

Preferably, a record is maintained at the transmitter of a transmitter variable, the transmitter variable initially corresponding to the exponent of an initial number. The step of placing each number in a form comprising a mantissa and an exponent comprises the step of defining the exponent as being equal to the transmitter variable. The transmitter variable is increased incrementally whenever the transmission mantissa is equal to or greater than the first predetermined value.

Conveniently, the first predetermined value comprises the highest value that the transmission mantissa may have.

Advantageously, the manipulation comprises the step of defining the transmission mantissa as being at least a part of the mantissa if the mantissa is greater than a second predetermined value, or defining the transmission mantissa as being equal to the second predetermined value if the mantissa is equal to or less than the second predetermined value. The transmission mantissa of the current number fulfills the second criterion when the transmission mantissa is equal to the second predetermined value. Altering the receiver variable in the second manner comprises decreasing the receiver variable incrementally.

Preferably, a record is maintained at the transmitter of a transmitter variable, the transmitter variable initially corresponding to the exponent of an initial number. The step of placing each number in a form comprising a mantissa and an exponent comprises the step of defining the exponent as being equal to the transmitter variable. The transmitter variable is incrementally decreased whenever the transmission mantissa is equal to or less than the second predetermined value.

Conveniently, the second predetermined value comprises the lowest value that the transmission mantissa may take.

Advantageously, the manipulation comprises the step of defining the transmission mantissa as being at least a part of the mantissa. The transmission mantissa of the current number fulfills the second criterion when the first x significant digits of the transmission mantissa are 0. Altering the receiver variable in the second manner comprises decreasing the receiver variable by x.

Preferably, a record is maintained, at the transmitter, of a transmitter variable, the transmitter variable initially corresponding to the exponent of an initial number. The step of placing each number in a form comprising a mantissa and an exponent comprises the step of defining the exponent as being equal to the transmitter variable. The transmitter variable is decreased by x whenever the first x significant digits of the transmission mantissa are 0.

Conveniently, the step of altering the receiver variable in a first or second manner occurs after the step of formulating a reconstructed number.

Alternatively, the transmission mantissa of the current number fulfills the first criterion if the transmission mantissa of the current number is less than the transmission mantissa of the previous number by more than a first predetermined amount. Altering the receiver variable in the first manner comprises increasing the receiver variable incrementally.

Advantageously, the transmission mantissa of the current number fulfills the second criterion if the transmission mantissa of the current number is greater than the transmission mantissa of the previous number by more than a second predetermined amount. Altering the receiver variable in the second manner comprises decreasing the receiver variable incrementally.

Preferably, the step of altering the receiver variable in a first or second manner occurs before the step of formulating a reconstructed number.

Conveniently, the step of placing each number in a form comprising a mantissa and an exponent comprises the step of defining a mantissa in a digital form in which the most significant digit of the mantissa is 1, the remaining digits comprising a characteristic portion; and the step of defining a transmission mantissa comprises defining a transmission mantissa being equal to the characteristic portion.

Another aspect of the present invention provides a method of receiving values of a parameter in a compressed form, the method comprising the step of: receiving transmission mantissas of successive numbers, the numbers representing the value of a parameter, and being characterized by the steps of: maintaining a record of a receiver variable, the receiver variable initially corresponding to the exponent of an initial number; formulating, for each received transmission mantissa, a reconstructed number comprising at least the transmission mantissa and an exponent corresponding to the receiver variable; and altering the receiver variable in a first manner if the transmission mantissa of the current number fulfills a first criterion, or altering the receiver variable in a second manner if the transmission mantissa of the current number fulfills the second criterion.

A further aspect of the present invention provides a receiver for receiving values of a parameter in a compressed form, the receiver being operable to receive transmission mantissas of successive numbers, the numbers representing the value of a parameter, and being characterized by being operable to: maintain a record of a receiver variable, the receiver variable initially corresponding to the exponent of an initial number; formulate, for each received transmission mantissa, a reconstructed number comprising at least the transmission mantissa and an exponent corresponding to the receiver variable; and alter the receiver variable in a first manner if the transmission mantissa of the current number fulfills a first criterion, or alter the receiver variable in a second manner if the transmission mantissa of the current number fulfills a second criterion.

Another aspect of the present invention provides a method for transmitting the value of a parameter in a compressed form, the method comprising the steps of: accepting successive numbers representing the value of a parameter; manipulating each number, the manipulation comprising placing the number in a form comprising a mantissa and an exponent, and defining a transmission mantissa as being at least a part of the mantissa, if the mantissa is below a first predetermined value, or defining the transmission mantissa as being equal to the first predetermined value if the mantissa is equal to or greater than the first predetermined value; transmitting to a receiver, in turn, the transmission mantissas only of the successive numbers; and receiving the transmission mantissas of the successive numbers at the receiver characterized by the steps of maintaining a record at the receiver of a receiver variable, the receiver variable initially corresponding to the exponent of an initial number; for each received transmission mantissa formulating at the receiver, a reconstructed number comprising at least the transmission mantissa and an exponent corresponding to the receiver variable; and increasing the receiver variable incrementally if the transmission mantissa of the current number is equal to the first predetermined value, or altering the receiver variable in a second manner if the transmission mantissa of the current number fulfills a second criterion.

BRIEF DESCRIPTION OF THE DRAWINGS

FIG. 1 shows a schematic view of a vehicle safety system in accordance with the invention.

DETAILED DESCRIPTION OF THE INVENTION

In order that the present invention may be more readily understood, embodiments thereof will now be described, with reference to the accompanying FIG. 1, which shows a schematic view of a vehicle safety system. The following description is merely exemplary in nature and is in no way intended to limit the invention or its application or uses.

With reference to FIG. 1, a vehicle safety system 1 is shown. The vehicle safety system 1 comprises a control unit 2 which, in the present example, is operable to inflate an airbag (not shown), and hence is located near the steering wheel of the vehicle 3 in which the safety system 1 is installed.

Various sensors are arranged around the vehicle 3 and are configured to detect a crash situation. The sensors include an accelerometer 4 which is located near the center of mass of the vehicle 3, front impact sensors 5 which are located near a front bumper 6 of the vehicle 3, and side impact sensors 7 which are arranged on respective opposing sides 8 of the vehicle 3. Communication lines 9 are provided between the sensors 4, 5, 7 and the control unit 2. In the event one of the sensors 4, 5, 7 detects a crash situation, data is transmitted along the communication lines 9 to the control unit 2, which inflates the airbag accordingly.

In many safety systems, information that is transmitted to trigger the deployment of, for instance, an airbag comprises the value of a measured parameter, rather than a direct indication of a crash situation. For instance, in the case of the accelerometer 4, information comprising a series of values representing the magnitude of the acceleration experienced by the accelerometer 4 at successive sampling intervals will be transmitted along the communication line 9 connecting the accelerometer 4 to the control unit 2.

As discussed above, it is desirable to compress this information to allow the information to be transmitted more rapidly or allow the use of cheaper transmission lines. It is, however, important that no delay is incurred in the compression process as, for instance, might occur if the compression algorithm were to wait for subsequent values before transmitting data relating to a current value, since this would negate the advantage gained by compressing the data to allow faster transmission thereof or the use of transmission lines.

The accelerometer 4 measures values of experienced acceleration, which are (in the present example) output in an absolute binary form. This is converted, by a processor (not shown) associated with accelerometer 4 to a binary scientific notation, comprising a mantissa and an exponent. In some cases, a normalized scientific notation (i.e. a normalized floating form) is used, in which the radix point is placed after the first non-zero digit. Examples of values in decimal form (for reference) in a binary absolute form, in a binary floating point form and in a binary non-normalized scientific form are shown below:

| Decimal Form | Binary Absolute Form | Binary Floating Form | Scientific Non-Normalized Form |
|---|---|---|---|
| 1 | 1.000 | 1.000E00 | 0.001E11 |
| 2 | 10.00 | 1.000E01 | 0.010E11 |
| 4 | 100.0 | 1.000E10 | 0.100E11 or 10.00E01 |

A first embodiment of the present invention will now be described. In an initial calibration step, the exponent of a first measured value of acceleration, or a predetermined exponent, is stored by the processor associated with the accelerometer 4 as a transmitter variable. Also, at least the exponent of the first measured value of acceleration may be transmitted along the communication line 9 to the control unit 2, which stores this initial exponent as a receiver variable. Alternatively, a further predetermined exponent is stored as the receiver variable.

Preferably, both the transmitter variable and the receiver variable are set to be a predetermined exponent (e.g. both set as 00) each time the system is initialized. After this initialization, or following the above-described initial calibration step, the treatment of subsequent sensed values of acceleration will be described.

When a new sensed value of acceleration is received by the processor, the value is again converted to a scientific form, comprising a mantissa and an exponent which is equal to the current transmitter variable. If the mantissa is equal to or below a first predetermined value, for instance 1.111, this mantissa will be transmitted to the control unit 2, assuming that the transmission line is selected to be able to transmit only 0.000 to 1.111 as possible mantissas The control unit 2 will then be able to reconstruct the scientific form of the sensed value of acceleration by using the received mantissa as the mantissa of the reconstructed number and using the receiver variable as the exponent of the reconstructed number. This means that without the exponent being transmitted to the control unit 2, the sensed value of acceleration can be fully reconstructed at the control unit 2.

If, however, the sensed value of acceleration is transmitted to a scientific form having the transmitter variable as its exponent and a mantissa that is greater than the first predetermined value (in this case, 1.111), then the value of 1.111 will be transmitted to the control unit 2 as the transmission mantissa. In this preferred embodiment of the invention, the first predetermined value is equal to the highest value that the mantissa can take, i.e. 1.111 in the case of a 4-digit mantissa. The processor transmits this highest value, and subsequently increases the stored transmitter variable by 1. Also, when the exponent of the sensed value is equal to the transmitting variable and the mantissa is equal to the first predetermined value, the transmitter variable should be increased by 1 after transmission of the mantissa to the control unit 2.

On receiving a mantissa which is equal to the first predetermined value, the control unit 2 again reconstructs the sensed value of acceleration, in the same manner as described above. Once this value has been reconstructed, however, the control unit 2 increases the stored receiver variable by 1.

It will be appreciated that (unless the mantissa of the converted sensed value of acceleration happens to be equal to the first predetermined value) this reconstructed value will be inaccurate, since the actual value of the mantissa of the scientific form of the sensed value of acceleration has not been transmitted to the control unit 2. However, the next-received sensed value of acceleration will have a scientific form with an exponent one unit higher than before, and the mantissa is likely to be below the first predetermined value, allowing this next sensed value of acceleration to be reconstructed correctly by the control unit 2. Thus, a skilled person will appreciate that as the sensed value of acceleration rises values of acceleration reconstructed at the control unit 2 will contain inaccuracies, but that these inaccuracies will disappear once the sensed value of acceleration stabilizes.

An advantage of the present invention is that a sudden rise in the sensed value of acceleration, corresponding to a mantissa of the converted sensed value of acceleration having more than 2 digits to the left of the radix point, can be tracked reliably. If, for example, the value of the sensed acceleration rises so that the mantissa of the scientific form thereof will have 3 digits to the left of the radix point, 3, the following steps will occur.

When the sharply increased new sensed value is converted, the mantissa thereof is compared with the first predetermined value. This comparison will reveal that the mantissa is higher than the first predetermined value, and therefore the transmitter will transmit, as the transmission mantissa, the first predetermined value (e.g. 1.111). The transmitter will also incrementally increase the stored transmitter variable by 1.

When the next sensed value is converted by the transmitter, assuming that the next value is approximately equal to the previous, sharply-increased value, the transmitter will again determine that the mantissa of the converted value is greater than the first predetermined value, having 2 digits to the left of the radix point, and will again transmit a mantissa equal to the first predetermined value, and incrementally increase the stored transmitter variable by 1.

When a new sensed value is converted, again assuming that this value is approximately equal to the previous two values, the transmitter will determine that the mantissa of this converted value is equal to or less than the first predetermined value, and will therefore simply transmit the mantissa of the converted value as the transmission mantissa, in the normal way.

Upon receiving the two first successive mantissas which are each equal to the first predetermined value, the control unit 2 will have increased the stored receiver variable by 1 on each occasion, and will therefore correctly reconstruct the scientific form of the final new sensed value its entirety. If the final mantissa is equal to the first predetermined value then of course the transmitter and receiver variables will be increased once more as described above.

A skilled person will, however, appreciate that the inaccuracy in the reconstructed value of the acceleration will be relatively large when the actual sensed value of acceleration changes rapidly. It is, however, considered that in many circumstances this temporary loss of accuracy is compensated for by the ability of the invention to track sharp changes in the sensed acceleration in a robust manner.

A skilled person will appreciate how the above-described technique may be applied to a situation in which the sensed value of acceleration decreases. It is, however, envisaged that there are a number of ways in which these changes may be tracked.

Firstly, the system may define a second predetermined variable (which may be transmitted as the transmission mantissa when the actual mantissa of the sensed value of acceleration falls below a certain value). For instance, if the mantissa of the sensed value of acceleration is equal to or less than a second predetermined variable, which may for example be half of the maximum transmittable mantissa, i.e. 0.111 or below in the case of a four-digit mantissa, the mantissa of the converted value will be transmitted, and the stored transmitter variable will be decreased by 1. The control unit 2 will reconstruct the sensed value of acceleration in the manner described above, and will also decrease the stored receiver variable by 1. This may be repeated until the receiver variable reaches its lowest possible value (e.g. 00). After this, the transmitter and receiver variables can no longer decrease and the mantissa will simply decrease if the sensed value of acceleration falls further.

Alternatively, the processor associated with the accelerometer 4 may be programmed so that, if the mantissa begins with x zeros (where x is greater than zero), then the actual mantissa of the sensed value of acceleration is transmitted, and the stored transmitter variable is subsequently decreased by x.

Upon receiving this mantissa, the control unit 2 will reconstruct the sensed value of acceleration in the manner described above, and will subsequently decrease the stored receiver variable by x.

For instance, a sensed value of acceleration may be converted into the number 1.010E04. Assuming that this does not represent a significant departure from the previous few sensed values, then the stored transmitter variable, as well as the stored receiver variable, will be 4. If the converted next sensed value of acceleration is 0.010E04, then the transmitter transmits the mantissa 0.010, and then decreases the stored transmitter variable by 2. Similarly, on receipt of the mantissa, which begins with two zeros, the stored exponent of the receiver is decreased by 2. After this, the mantissas corresponding to the sensed values of acceleration are transmitted as normal. In this way, when the sensed value of acceleration decreases rapidly, the changes can be tracked quickly and accurately.

When the exponent of the scientific form of the sensed value of acceleration is zero, and the stored transmitter variable is also zero, then the exponent will not decrease any further. Once this has occurred, the mantissa may drop as low as 0000, which will typically correspond to no sensed acceleration.

In a further alternative method of handling decreasing sensed values of acceleration, only mantissas equal to or greater than a second predetermined value are transmitted. If the mantissa converted new sensed value is below the second predetermined value, the second predetermined value will be transmitted instead. This means that only values from 1.000 to 1.111 are transmitted. In this case, the first digit (the integer) is always 1, and thus will not need to be transmitted. This means that only the fractional part of the mantissa or the second predetermined value is transmitted. This reduction in the quantity of data that needs to be transmitted allows the use of a cheaper transmission line, having a lesser transmission capacity.

After a value equal to the fractional part of the second predetermined value (e.g. 000) is transmitted, the transmitter variable will be decreased by 1, and after the sensed value of acceleration is being reconstructed at the control unit 2, the receiver variable will also be decreased by 1. In this embodiment, the decreasing values are handled in a manner analogous to that with which increasing values are dealt.

A second embodiment of the present invention will now be described. In this embodiment, the sensed value of acceleration is converted to a normalized floating point form. Again, at least the exponent of a first measured value of acceleration is transmitted along the communication line 9 to the control unit 2, which stores this value as the receiver variable. With this embodiment, however, no transmitter variable need be stored.

New values of sensed acceleration are manipulated into the form "a.bcdEef", with "a" representing the integer part of the mantissa, "bcd" representing the fractional part of the mantissa and "ef" representing the exponent. For a normalized floating point form, a will always be 1 and so does not need to be transmitted. Only the fractional part of the mantissa, therefore, needs to be transmitted to the control unit 2 as the transmission mantissa. In common with the above-described embodiment, the exponent part of the binary floating point forms are discarded prior to transmission, and in this embodiment the integer is also discarded. The manner in which this discarded data can be reconstructed upon receipt of the transmitted part of the mantissas by the control unit 2 will be described below.

Assuming that the measured acceleration is continuous and is not subject to very large fluctuations between consecutive samples (this might be achieved by passing the samples through a low pass filter), then the mantissa will jump from a value close to or equal to its upper limit to a value close to or equal to its lower limit as the exponent increases by one unit. To illustrate this, the following table shows the variations in a decimal value, the absolute binary equivalent, the binary floating point equivalent, and the fractional part (which might also be referred to as the characteristic part) of the mantissa of the binary floating point equivalent, as the decimal value rises gradually from 1 to 2:

| Fractional Form | Decimal Form | Binary Absolute Form | Binary Floating Form | Fractional Part of Mantissa |
|---|---|---|---|---|
| 8/8 | 1.000 | 1.000 | 1.000E00 | 000 |
| 9/8 | 1.125 | 1.001 | 1.001E00 | 001 |
| ... | | | | |
| 15/8 | 1.875 | 1.111 | 1.111E00 | 111 |
| 16/8 | 2.000 | 10.00 | 1.000E01 | 000 |

It can be seen that as the decimal number rises from just below 2 to 2, the exponent changes from 00 to 01. At the same time, the transmitted part of the mantissa drops from 111 (the highest value thereof) to 000 (the lowest value thereof). Conversely, it will be appreciated that, if the decimal number dropped from 2 to slightly below 2, the exponent would drop from 01 to 00 and the transmitted part of the mantissa would rise sharply from 000 to 111.

If an initial sensed value acceleration is 1 (in arbitrary decimal units), and exponent of the binary floating point equivalent of this value is transmitted from the accelerometer 4 along the communication line 9 to the control unit 2, where this information is stored, subsequent changes in the exponent may be determined simply from knowledge of the transmitted part of the mantissa only of subsequent values. In the example given above, it could be determined that, when the transmitted part of the mantissa changes from 111 to 000, the value of the sensed acceleration has risen from just below 2 to 2, and hence the control unit 2 may raise the stored receiver variable by 1 this time before the current value is reconstructed, and effectively reconstruct the binary floating point form of the sensed acceleration by using the formula 1.bcdExy (where "xy" is the stored receiver variable), without the need for the entire binary floating point form to be transmitted.

Conversely, if the control unit 2 receives a series of transmitted parts of mantissas and a transmitted part of 111 is received immediately after a mantissa of 000, it may be determined that the exponent of the binary floating form of the sensed acceleration has decreased by 1, and hence the value of the stored receiver variable is decreased by 1.

In this way, the sensed acceleration may be transmitted accurately from the accelerometer 4 to the control unit 2 in a compressed form, and transmission may occur in real time, without significant delays occurring.

The size of the transmitted part of the mantissa may be selected in dependence upon the type of data that is to be transmitted, and upon the particular application. However, in preferred embodiments of the present invention, the mantissa has at least four digits, and the exponent has at least two digits.

In this embodiment, the format of the numbers is preferably such that the most significant digit of this mantissa is always 1. It will be readily understood from the above table how this is achieved. A desirable consequence of this is that, since the most significant digit is always the same, this digit becomes "redundant information" and need not be transmitted to the receiver.

When used in this specification and claims, the terms "comprises" and "comprising" and variations thereof mean that the specified features, steps or integers are included. The terms are not to be interpreted to exclude the presence of other features, steps or components.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilized for realizing the invention in diverse forms thereof. While the above description constitutes one or more embodiments of the present invention, it will be appreciated that the invention is susceptible to modification, variation and change without departing from the proper scope and fair meaning of the accompanying claims.

The invention claimed is:

1. A method for transmitting a value of a parameter in a compressed form, the method comprising the steps of:
   accepting successive numbers representing the value of the parameter;
   manipulating each of the successive numbers, the manipulation comprising the steps of placing the number in a form comprising a mantissa and an exponent, and defining a transmission mantissa to be transmitted;
   transmitting to a receiver, the transmission mantissas only of the successive numbers; and
   receiving the transmission mantissas of the successive numbers at the receiver;
   maintaining a record, at the receiver, of a receiver variable, the receiver variable initially corresponding to the exponent of an initial number;
   formulating at the receiver, for each received transmission mantissa, a reconstructed number comprising at least the transmission mantissa and an exponent corresponding to the receiver variable; and
   altering the receiver variable in a first manner if the transmission mantissa of the current number fulfills a first criterion, or altering the receiver variable in a second manner if the transmission mantissa of the current number fulfills a second criterion.

2. The method according to claim 1, wherein:
   the step of manipulating comprises the step of defining the transmission mantissa as being at least a part of the mantissa, if the mantissa is below a first predetermined value, or defining the transmission mantissa as being equal to the first predetermined value if the mantissa is equal to or greater than the first predetermined value;
   wherein the transmission mantissa of the current number fulfills the first criterion when the transmission mantissa is equal to the first predetermined value; and
   wherein altering the receiver variable in the first manner comprises increasing the receiver variable incrementally.

3. The method according to claim 2, wherein:
   a record is maintained at the transmitter of a transmitter variable, the transmitter variable initially corresponding to the exponent of an initial number;
   the step of placing each number in a form comprising a mantissa and an exponent further comprises the step of defining the exponent as being equal to the transmitter variable; and
   the transmitter variable is increased incrementally whenever the transmission mantissa is equal to or greater than the first predetermined value.

4. The method according to claim 2, wherein the first predetermined value comprises the highest value of the transmission mantissa.

5. The method according to claim 1, wherein:
   the manipulation further comprises the step of defining the transmission mantissa as being at least a part of the mantissa if the mantissa is greater than a second predetermined value, or defining the transmission mantissa as being equal to the second predetermined value if the mantissa is equal to or less than the second predetermined value;
   the transmission mantissa of the current number fulfills the second criterion when the transmission mantissa is equal to the second predetermined value; and
   altering the receiver variable in the second manner comprises decreasing the receiver variable incrementally.

6. The method according to claim 5, wherein:
   a record is maintained, at the transmitter of a transmitter variable, the transmitter variable initially corresponding to the exponent of an initial number;
   the step of placing each number in a form comprising a mantissa and an exponent further comprises the step of defining the exponent as being equal to the transmitter variable; and
   the transmitter variable is incrementally decreased whenever the transmission mantissa is equal to or less than the second predetermined value.

7. The method according to claim 5, wherein the second predetermined value comprises the lowest value that the transmission mantissa may take.

8. The method according to claim 1, wherein:
   the step of manipulating comprises the step of defining the transmission mantissa as being at least a part of the mantissa;
   the transmission mantissa of the current number fulfills the second criterion when the first x significant digits of the transmission mantissa are 0; and
   altering the receiver variable in the second manner comprises decreasing the receiver variable by x.

9. The method according to claim 8, further comprising the step of:
   maintaining a record at the transmitter of a transmitter variable, the transmitter variable initially corresponding to the exponent of an initial number;
   the step of placing each number in a form comprising a mantissa and an exponent further comprises the step of defining the exponent as being equal to the transmitter variable; and
   the transmitter variable is decreased by x whenever the first x significant digits of the transmission mantissa are 0.

10. The method according to claim 1, wherein the step of altering the receiver variable in a first or second manner occurs after the step of formulating a reconstructed number.

11. The method according to claim 1, wherein:
the transmission mantissa of the current number fulfills the first criterion if the transmission mantissa of the current number is less than the transmission mantissa of the previous number by more than a first predetermined amount; and
altering the receiver variable in the first manner comprises increasing the receiver variable incrementally.

12. The method according to claim 11, wherein the step of altering the receiver variable in a first or second manner occurs before the step of formulating a reconstructed number.

13. The method according to claim 11, wherein:
the step of placing each number in a form comprising a mantissa and an exponent comprises the step of defining a mantissa in a digital form in which the most significant digit of the mantissa is 1, the remaining digits comprising a characteristic portion; and
the step of defining a transmission mantissa comprises defining a transmission mantissa being equal to the characteristic portion.

14. The method according to claim 11, wherein a low pass filter is applied to the successive numbers, to limit the difference between the successive numbers.

15. The method according to claim 1, wherein:
the transmission mantissa of the current number fulfills the second criterion if the transmission mantissa of the current number is greater than the transmission mantissa of the previous number by more than a second predetermined amount; and
altering the receiver variable in the second manner comprises decreasing the receiver variable incrementally.

16. The method according to claim 15, wherein the step of altering the receiver variable in a first or second manner occurs before the step of formulating a reconstructed number.

17. The method according to claim 15, wherein:
the step of placing each number in a form comprising a mantissa and an exponent comprises the step of defining a mantissa in a digital form in which the most significant digit of the mantissa is 1, the remaining digits comprising a characteristic portion; and
the step of defining a transmission mantissa comprises defining a transmission mantissa being equal to the characteristic portion.

18. The method according to claim 15, wherein a low pass filter is applied to the successive numbers, to limit the difference between the successive numbers.

19. A method of receiving values of a parameter in a compressed form, the method comprising the steps of:
receiving transmission mantissas of successive numbers, the numbers representing the value of a parameter at a receiver;
maintaining a record at the receiver, of a receiver variable, the receiver variable initially corresponding to the exponent of an initial number;
formulating at the receiver, for each received transmission mantissa, a reconstructed number comprising at least the transmission mantissa and an exponent corresponding to the receiver variable; and
altering the receiver variable in a first manner if the transmission mantissa of the current number fulfills a first criterion, or altering the receiver variable in a second manner if the transmission mantissa of the current number fulfills the second criterion.

20. A receiver apparatus for receiving values of a parameter in a compressed form, the receiver apparatus comprising:
a processor being configured to receive transmission mantissas of successive numbers representing the value of a parameter;
the processor being configured maintain a record of a receiver variable, the receiver variable initially corresponding to the exponent of an initial number;
the processor being configured to formulate, for each received transmission mantissa, a reconstructed number comprising at least the transmission mantissa and an exponent corresponding to the receiver variable; and
the processor being configured to alter the receiver variable in a first manner if the transmission mantissa of the current number fulfills a first criterion, or alter the receiver variable in a second manner if the transmission mantissa of the current number fulfills a second criterion.

21. A method for transmitting a value of a parameter in a compressed form, the method comprising the steps of:
accepting successive numbers representing the value of the parameter;
manipulating each number, the manipulation comprising the steps of placing the number in a form comprising a mantissa and an exponent, and defining a transmission mantissa as being at least a part of the mantissa if the mantissa is below a first predetermined value, or defining the transmission mantissa as being equal to the first predetermined value if the mantissa is equal to or greater than the first predetermined value;
transmitting to a receiver, in turn, the transmission mantissas only of the successive numbers; and
receiving the transmission mantissas of the successive numbers at the receiver, characterized by the steps of:
maintaining a record at the receiver of a receiver variable, the receiver variable initially corresponding to the exponent of an initial number;
formulating at the receiver for each received transmission mantissa, a reconstructed number comprising at least the transmission mantissa and an exponent corresponding to the receiver variable; and
increasing the receiver variable incrementally if the transmission mantissa of the current number is equal to the first predetermined value, or altering the receiver variable in a second manner if the transmission mantissa of the current number fulfills a second criterion.

* * * * *